(12) United States Patent
Liang et al.

(10) Patent No.: US 11,335,712 B2
(45) Date of Patent: May 17, 2022

(54) ARRAY SUBSTRATE, DISPLAY APPARATUS, AND METHOD OF FABRICATING ARRAY SUBSTRATE

(71) Applicant: BOE Technology Group Co., Ltd., Beijing (CN)

(72) Inventors: Zhiwei Liang, Beijing (CN); Muxin Di, Beijing (CN); Ke Wang, Beijing (CN); Yingwei Liu, Beijing (CN); Xiaoyan Zhu, Beijing (CN); Zhanfeng Cao, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 267 days.

(21) Appl. No.: 16/755,652

(22) PCT Filed: May 13, 2019

(86) PCT No.: PCT/CN2019/086664
§ 371 (c)(1),
(2) Date: Apr. 13, 2020

(87) PCT Pub. No.: WO2020/227896
PCT Pub. Date: Nov. 19, 2020

(65) Prior Publication Data
US 2021/0408052 A1    Dec. 30, 2021

(51) Int. Cl.
*H01L 27/12* (2006.01)
*H01L 33/62* (2010.01)

(52) U.S. Cl.
CPC .......... *H01L 27/124* (2013.01); *H01L 27/127* (2013.01); *H01L 33/62* (2013.01); *H01L 2933/0066* (2013.01)

(58) Field of Classification Search
CPC ..... H01L 27/124; H01L 27/127; H01L 33/62; H01L 2933/0066; H01L 27/1214;
(Continued)

(56) References Cited

U.S. PATENT DOCUMENTS 6,005,262 A * 12/1999 Cunningham ...... H01S 5/02325
257/435
2004/0155337 A1* 8/2004 Strandberg ........ H01L 23/49816
257/738
(Continued)

FOREIGN PATENT DOCUMENTS

CN    106409796 A    2/2017
CN    109524421 A    3/2019
CN    109585462 A    4/2019

OTHER PUBLICATIONS

International Search Report & Written Opinion dated Feb. 18, 2020, regarding PCT/CN2019/086664.

*Primary Examiner* — Victor A Mandala
(74) *Attorney, Agent, or Firm* — Intellectual Valley Law, P.C.

(57) ABSTRACT

An array substrate is provided. The array substrate includes a base substrate; a first bonding pad layer including a plurality of first bonding pads on a first side of the base substrate; a second bonding pad layer including a plurality of second bonding pads on a second side of the base substrate, wherein the second side is opposite to the first side; and a plurality of signal lines on a side of the second bonding pad layer away from the base substrate. A respective one of the plurality of second bonding pads extends through the base substrate to electrically connect to a respective one of the plurality of first bonding pads. The respective one of the plurality of first bonding pads includes
(Continued)

a protruding portion protruding away from the first side of the base substrate along a direction from the second side to the first side.

20 Claims, 7 Drawing Sheets

(58) Field of Classification Search
CPC ............. H01L 25/0753; H01L 27/3248; H01L 2224/1403; H01L 2224/16225; H01L 2924/181; H01L 27/1259; H01L 27/156; H01L 27/3244
See application file for complete search history.

(56) References Cited

U.S. PATENT DOCUMENTS

| | | | |
|---|---|---|---|
| 2005/0146033 A1* | 7/2005 | Strandberg | H01L 23/13 257/738 |
| 2005/0155222 A1 | 7/2005 | Nakamura | |
| 2006/0087021 A1* | 4/2006 | Hirose | H01L 24/17 257/E23.079 |
| 2006/0145345 A1* | 7/2006 | Choi | H01L 23/49827 257/738 |
| 2007/0164429 A1* | 7/2007 | Lee | H01L 23/49822 257/E23.079 |
| 2008/0050909 A1* | 2/2008 | Lin | H01L 28/10 257/E21.575 |
| 2010/0314757 A1* | 12/2010 | Sugiyama | H01L 21/561 257/737 |
| 2012/0018897 A1* | 1/2012 | Park | H01L 25/0652 257/774 |
| 2016/0353568 A1* | 12/2016 | Lee | H01L 23/498 |
| 2017/0084640 A1* | 3/2017 | Gao | H01L 27/3248 |
| 2017/0162545 A1* | 6/2017 | Park | H01L 25/50 |
| 2017/0263523 A1* | 9/2017 | Ji | H01L 24/05 |
| 2018/0261575 A1* | 9/2018 | Tagami | H01L 27/11573 |
| 2019/0131225 A1* | 5/2019 | Jeong | H01L 21/4853 |
| 2019/0206927 A1* | 7/2019 | Lee | H01L 27/153 |
| 2019/0334067 A1* | 10/2019 | Lo | H01L 25/167 |
| 2020/0043400 A1* | 2/2020 | Chen | H01L 25/0753 |
| 2020/0105721 A1* | 4/2020 | Park | H01L 27/11521 |
| 2020/0266182 A1* | 8/2020 | Nishikawa | G11C 16/26 |
| 2020/0286875 A1* | 9/2020 | Nishida | H01L 24/09 |
| 2020/0286905 A1* | 9/2020 | Kai | H01L 29/40117 |
| 2020/0295043 A1* | 9/2020 | Nishida | H01L 21/76832 |
| 2020/0343161 A1* | 10/2020 | Wu | H01L 23/481 |
| 2020/0357811 A1* | 11/2020 | Kim | H01L 23/528 |
| 2021/0005593 A1* | 1/2021 | Lee | H01L 24/80 |
| 2021/0408350 A1* | 12/2021 | Lo | H01L 24/10 |

* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2019/086664, filed May 13, 2019, the contents of which are incorporated by reference in the entirety.

TECHNICAL FIELD

The present invention relates to display technology, more particularly, to an array substrate, a display apparatus, and a method of fabricating an array substrate.

BACKGROUND

Many techniques have been developed to reduce the frame width of a display panel. For example, gate-on-array (GOA) technique integrates gate driving circuits on the array substrate so that the frame width on two sides of the display panel can be reduced. In another example, chip-on-film technique enables bonding integrated circuits on a flexible printed circuit board, and folding the flexible printed circuit board on a back side of the display panel, thereby reducing the frame width on lower side of the display panel.

SUMMARY

In one aspect, the present invention provides an array substrate, comprising a base substrate; a first bonding pad layer comprising a plurality of first bonding pads on a first side of the base substrate; a second bonding pad layer comprising a plurality of second bonding pads on a second side of the base substrate, wherein the second side is opposite to the first side; and a plurality of signal lines on a side of the second bonding pad layer away from the base substrate; wherein the plurality of signal lines are respectively electrically connected to the plurality of second bonding pads; a respective one of the plurality of second bonding pads extends through the base substrate to electrically connect to a respective one of the plurality of first bonding pads; and the respective one of the plurality of first bonding pads comprises a protruding portion protruding away from the first side of the base substrate along a direction from the second side to the first side.

Optionally, an orthographic projection of the respective one of the plurality of second bonding pads on the base substrate at least partially overlaps with an orthographic projection of the respective one of the plurality of first bonding pads on the base substrate.

Optionally, the respective one of the plurality of first bonding pads further comprises a base portion recessing into the first side of the base substrate along a direction from the first side to the second side; and the respective one of the plurality of second bonding pads is electrically connected to the protruding portion of the respective one of the plurality of first bonding pads through the base portion of the respective one of the plurality of first bonding pads.

Optionally, an orthographic projection of the base portion on the base substrate covers an orthographic projection of the protruding portion on the base substrate.

Optionally, the protruding portion has a thickness relative to the first side of the base substrate along the direction from the second side to the first side greater than 500 nm.

Optionally, the plurality of signal lines comprise a plurality of gate lines and a plurality of data lines; the plurality of first bonding pads comprise a plurality of first gate line bonding pads and a plurality of first data line bonding pads; the plurality of second bonding pads comprise a plurality of second gate line bonding pads and a plurality of second data line bonding pads; the plurality of first gate line bonding pads are respectively electrically connected to the plurality of gate lines respectively through the plurality of second gate line bonding pads; and the plurality of first data line bonding pads are respectively electrically connected to the plurality of data lines respectively through the plurality of second data line bonding pads.

Optionally, the first bonding pad layer has a multiple sub-layer structure.

In another aspect, the present invention provides a display apparatus, comprising the array substrate described herein or fabricated by a method described herein, and one or more integrated driving circuits connected to the array substrate; wherein the one or more integrated driving circuits are attached to the first side of the base substrate.

In another aspect, the present invention provides a method of fabricating an array substrate, comprising forming a first bonding pad layer comprising a plurality of first bonding pads on a first side of a base substrate; forming a second bonding pad layer comprising a plurality of second bonding pads on a second side of the base substrate, wherein the second side is opposite to the first side; and forming a plurality of signal lines on a side of the second bonding pad layer away from the base substrate; wherein the plurality of signal lines are respectively electrically connected to the plurality of second bonding pads; a respective one of the plurality of second bonding pads extends through the base substrate to electrically connect to a respective one of the plurality of first bonding pads; and the respective one of the plurality of first bonding pads comprises a protruding portion protruding away from the first side of the base substrate along a direction from the second side to the first side.

Optionally, forming the first bonding pad layer comprises providing a support substrate; forming a plurality of first vias in the support substrate or in a layer on the support substrate; forming a first conductive material layer at least partially filling in the plurality of first vias; and patterning the first conductive material layer to obtain the plurality of first bonding pads, thereby forming the first bonding pad layer.

Optionally, forming the plurality of first vias comprises forming a first insulating material layer on the support substrate; wherein the plurality of first vias are formed at least partially extending into the first insulating material layer; and the first conductive material layer is formed on a side of the first insulating material layer away from the support substrate.

Optionally, forming the plurality of first vias comprises patterning the support substrate to form the plurality of first vias; wherein the plurality of first vias at least partially extend into the support substrate; and the first conductive material layer is formed on the support substrate.

Optionally, subsequent to forming the first bonding pad layer, the method further comprises forming a second insulating material layer on a side of the first bonding pad layer away from the first insulating material layer; forming a plurality of second vias extending through the second insulating material layer, thereby forming the base substrate;

forming a second conductive material layer on a side of the base substrate away from the first bonding pad layer, wherein the second conductive material layer at least partially fills in the plurality of second vias; and patterning the second conductive material layer to obtain the plurality of second bonding pads, thereby forming the second bonding pad layer.

Optionally, subsequent to forming the plurality of first vias and prior to forming the first conductive material layer, the method further comprises forming a debonding layer on the support substrate; wherein the first conductive material layer and the base substrate are formed on a side of the debonding layer away from the support substrate.

Optionally, the debonding layer is formed to be in direct contact with the support substrate; and the debonding layer has a first adhesive strength to the support substrate, a second adhesive strength to the base substrate, and a third adhesive strength to the first bonding pad layer, the first adhesive strength being greater than the second adhesive strength and greater than the third adhesive strength.

Optionally, subsequent to forming the plurality of first vias and prior to forming the first conductive material layer, the method further comprises forming an intermediate layer on a side of the first insulating material layer away from the support substrate; wherein the debonding layer is formed on a side of the intermediate layer away from the first insulating material layer; and the debonding layer has a first adhesive strength to the intermediate layer, a second adhesive strength to the base substrate, and a third adhesive strength to the first bonding pad layer, the first adhesive strength being greater than the second adhesive strength and greater than the third adhesive strength.

Optionally, the plurality of first bonding pads and the debonding layer together form a substantially flat surface.

Optionally, the respective one of the plurality of first bonding pads further comprises a base portion; and the base portion protrudes above an entire surface of the debonding layer.

Optionally, the intermediate layer is formed using an inorganic insulating material; the debonding layer is formed using an organic resin material; the first insulating material layer is formed using a flexible material; and the first bonding pad layer and the second bonding pad layer are formed using a metallic material.

Optionally, the method further comprises separating the debonding layer from the base substrate and the first bonding pad layer, thereby removing the debonding layer and the support substrate, exposing the protruding portion of the respective one of the plurality of first bonding pads.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides a display panel or an array substrate having the driving circuits integrated onto a back side of the display panel or the array substrate. In doing so, the frame width of the display panel can be further reduced because these driving circuits are not disposed on the frame portion. Electrical connection between signal lines and the driving circuits can be accomplished, e.g., by a through-PI-via (TPV) technique. It is discovered in the present disclosure that it is difficult to bond the driving circuits to the bonding pads on the back side of the display panel or the array substrate, because surfaces of the bonding pads are substantially on a same level as the surface of the back side of the display panel or the array substrate.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a base substrate; a first bonding pad layer including a plurality of first bonding pads on a first side of the base substrate; a second bonding pad layer including a plurality of second bonding pads on a second side of the base substrate, wherein the second side is opposite to the first side; and a plurality of signal lines on a side of the second bonding pad layer away from the base substrate. Optionally, the plurality of signal lines are respectively electrically connected to the plurality of second bonding pads. Optionally, a respective one of the plurality of second bonding pads extends through the base substrate to electrically connect to a respective one of the plurality of first bonding pads. Optionally, the respective one of the plurality of first bonding pads comprises a protruding portion protruding away from the first side of the base substrate along a direction from the second side to the first side.

Figure 1:
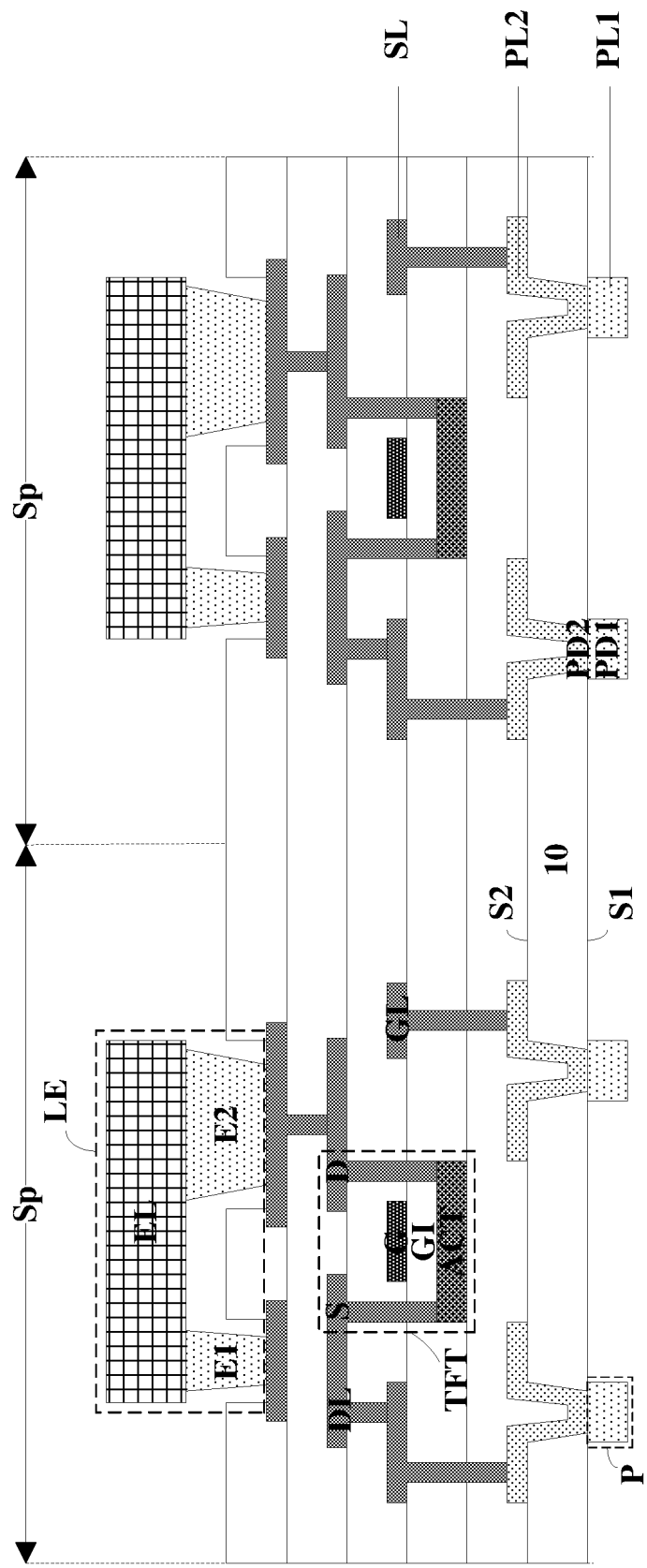
FIG. 1 is a cross-sectional view of an array substrate in some embodiments according to the present disclosure.

FIG. 1 is a cross-sectional view of an array substrate in some embodiments according to the present disclosure. Referring to FIG. 1, the array substrate in some embodiments includes a plurality of subpixels Sp. The array substrate includes a plurality of light emitting elements LE respectively in the plurality of subpixels Sp. Specifically, the array substrate includes a base substrate 10, a first bonding pad layer PL1 including a plurality of first bonding pads PD1 on a first side S1 of the base substrate 10; a second bonding pad layer PL2 including a plurality of second bonding pads PD2 on a second side S2 of the base substrate, wherein the second side S2 is opposite to the first side S1; and a plurality of signal lines SL on a side of the second bonding pad layer PL2 away from the base substrate 10. Optionally, the first side S1 is a back side of the array substrate exposed to the external environment, and the second side S2 is a side of the base substrate 10 internal to the array substrate, and is in direct contact with other layers of the array substrate.

In some embodiments, the plurality of signal lines SL are respectively electrically connected to the plurality of second bonding pads PD2. Optionally, a respective one of the plurality of second bonding pads PD2 extends through the base substrate 10 to electrically connect to a respective one of the plurality of first bonding pads PD1. Optionally, the respective one of the plurality of first bonding pads PD1 includes a protruding portion P protruding away from the first side S1 of the base substrate 10 along a direction from the second side S2 to the first side S1. The respective one of the plurality of first bonding pads PD1 in the array substrate of FIG. 1 includes only a protruding portion P.

The plurality of signal lines SL include various appropriate signal lines for bonding with various corresponding driving circuits to be placed on the first side S1 of the base substrate. Referring to FIG. 1, the plurality of signal lines SL in some embodiments includes a plurality of gate lines GL and a plurality of data lines DL. A respective one of the plurality of gate lines GL is electrically connected to a gate electrode G of a respective one of a plurality of thin film transistors TFT. A respective one of the plurality of data lines DL is electrically connected to a source electrode S of the respective one of the plurality of thin film transistors TFT.

In some embodiments, the plurality of first bonding pads PD1 include a plurality of first gate line bonding pads (respectively connected to the plurality of gate lines GL) and a plurality of first data line bonding pads (respectively connected to the plurality of data lines DL). Optionally, the plurality of second bonding pads PD2 includes a plurality of second gate line bonding pads (respectively connected to the plurality of gate lines GL) and a plurality of second data line bonding pads (respectively connected to the plurality of data lines DL). The plurality of first gate line bonding pads are respectively electrically connected to the plurality of gate lines GL respectively through the plurality of second gate line bonding pads. The plurality of first data line bonding pads are respectively electrically connected to the plurality of data lines DL respectively through the plurality of second data line bonding pads.

Optionally, the plurality of signal lines SL further includes a plurality of common voltage signal lines. Optionally, the plurality of signal lines SL further includes a plurality of touch control signal lines. Optionally, the plurality of signal lines SL further includes a plurality of power lines. Optionally, the plurality of signal lines SL further includes a plurality of clock signal lines.

Various appropriate driving circuits may be attached to the first side S1 of the base substrate 10 and bond to the plurality of signal lines SL. Examples of driving circuits include a gate driving circuit for providing gate scanning signals to the plurality of gate lines GL, a data driving circuit for providing data signals to the plurality of data lines DL, a touch control driving circuit for providing touch scanning signals to the plurality of touch control signal lines. These driving circuits may be integrated circuits.

Referring to FIG. 1, the array substrate in some embodiments further includes a plurality of thin film transistors TFT. In one example, and referring to FIG. 1, a respective one of the plurality of thin film transistors TFT includes an active layer ACT on the base substrate 10, a gate insulating layer GI on a side of the active layer ACT away from the base substrate 10, a gate electrode G on a side of the gate insulating layer GI away from the active layer ACT, a source electrode S and a drain electrode D respectively electrically connected to the active layer ACT. The source electrode S is electrically connected to a respective one of the plurality of data lines DL, which extends through at least the gate insulating layer GI to electrically connected to a respective one of the plurality of second bonding pads PD2. The respective one of the plurality of second bonding pads PD2 extends through the base substrate 10 to electrically connect to a respective one of the plurality of first bonding pads PD1. The respective one of the plurality of first bonding pads PD1 that is connected to the source electrode S is bonded to a data driving circuit to be disposed on the first side S1 of the base substrate.

Referring to FIG. 1, the array substrate in some embodiments further includes a plurality of light emitting elements LE. In one example, and referring to FIG. 1, a respective one of the plurality of light emitting elements LE includes a first electrode E1, a light emitting layer EL, and a second electrode E2. The second electrode E2 is electrically connected to the drain electrode of a respective one of the plurality of thin film transistors TFT. The first electrode E1 may be a cathode and is provided with a common voltage.

Various appropriate light emitting elements may be used in the present array substrate. Examples of appropriate light emitting elements include organic light emitting diodes, quantum dots light emitting diodes, and micro light emitting diodes. In one example, the plurality of light emitting elements LE are a plurality of micro light emitting diodes. In some embodiments, a respective one of the plurality of micro light emitting diodes includes a first electrode; a first type doped semiconductor layer; a multiple quantum wells layer on the first type doped semiconductor layer; a second type doped semiconductor layer on a side of the multiple quantum wells layer away from the first type doped semiconductor layer; and a second electrode. Optionally, the first type doped semiconductor layer is a p-doped semiconductor layer, and the second type doped semiconductor layer is an n-doped semiconductor layer. Optionally, the first type doped semiconductor layer is an n-doped semiconductor layer, and the second type doped semiconductor layer is a p-doped semiconductor layer. Optionally, the p-doped semiconductor layer is p-doped GaN layer, and the n-doped semiconductor layer is an n-doped GaN layer.

In some embodiments, the base substrate 10 is a flexible base substrate including a flexible material. Various appropriate elastomer polymer materials may be used for making the base substrate 10. Examples of appropriate elastomer polymers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In some embodiments, and referring to FIG. 1, an orthographic projection of the respective one of the plurality of second bonding pads PD2 on the base substrate 10 at least partially overlaps with an orthographic projection of the respective one of the plurality of first bonding pads PD1 on the base substrate 10. Optionally, the orthographic projection of the respective one of the plurality of second bonding pads PD2 on the base substrate 10 covers the orthographic projection of the respective one of the plurality of first bonding pads PD1 on the base substrate 10. Optionally, the orthographic projection of the respective one of the plurality of first bonding pads PD1 on the base substrate 10 covers the orthographic projection of the respective one of the plurality of second bonding pads PD2 on the base substrate 10.

Figure 2:
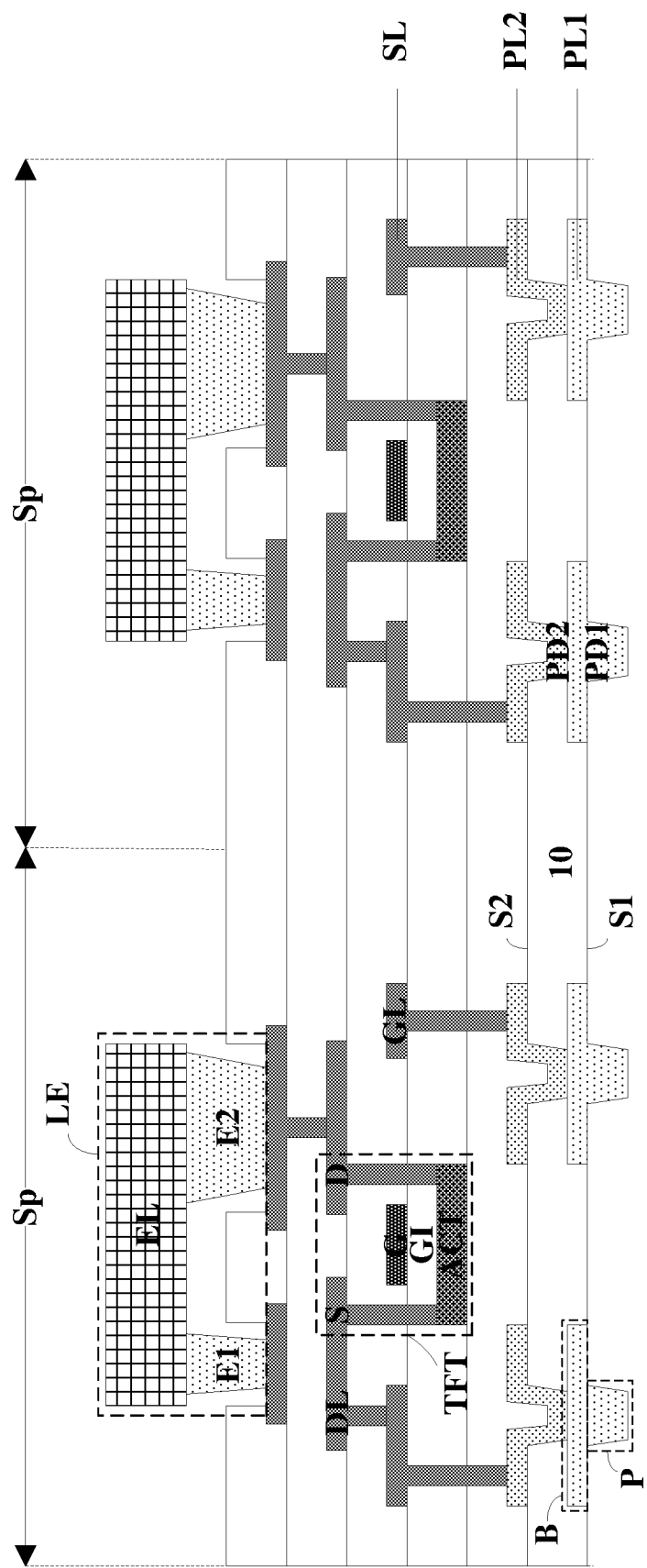
FIG. 2 is a cross-sectional view of an array substrate in some embodiments according to the present disclosure.

FIG. 2 is a cross-sectional view of an array substrate in some embodiments according to the present disclosure. Referring to FIG. 2, in some embodiments, the respective one of the plurality of first bonding pads PD1 includes a protruding portion P protruding away from the first side S1 of the base substrate 10 along a direction from the second side S2 to the first side S1, and further includes a base portion B recessing into the first side S1 of the base substrate 10 along a direction from the first side S1 to the second side S2. The respective one of the plurality of second bonding pads PS2 is electrically connected to the protruding portion P of the respective one of the plurality of first bonding pads PD1 through the base portion B of the respective one of the plurality of first bonding pads PD1.

In some embodiments, and referring to FIG. 2, an orthographic projection of the base portion B on the base substrate 10 at least partially overlaps with an orthographic projection of the protruding portion P on the base substrate 10. Optionally, the orthographic projection of the base portion B on the base substrate 10 covers the orthographic projection of the protruding portion P on the base substrate 10. Optionally, the orthographic projection of the protruding portion P on the base substrate 10 covers the orthographic projection of the base portion B on the base substrate 10.

Optionally, the protruding portion P has a thickness relative to the first side of the base substrate along the direction from the second side to the first side greater than 500 nm, e.g., greater than 600 nm, greater than 700 nm, or greater than 800 nm. Optionally, the protruding portion P has a width in a range of 20 μm to 70 μm, e.g., 20 μm to 40 μm, 40 μm to 60 μm, or 60 μm to 70 μm. Optionally, the protruding portion P has a length in a range of 500 μm to 1000 μm, e.g., 500 μm to 700 μm, 700 μm to 900 μm, or 900 μm to 1000 μm.

Various appropriate conductive materials and various appropriate fabricating methods may be used to make the first bonding pad layer PL1 and the second bonding pad layer PL2. For example, a conductive material may be deposited on the substrate (e.g., by sputtering, vapor deposition, solution coating, or spin coating); and patterned (e.g., by lithography such as a wet etching process) to form the conductive material layer. Examples of appropriate conductive materials for making the conductive material layer include, but are not limited to, various metal materials such as aluminum, tungsten, copper, molybdenum, silver, chromium, titanium, tantalum, and alloys or laminates containing the same; and various conductive metal oxides such as indium tin oxide.

In some embodiments, the first bonding pad layer has a multiple sub-layer structure. Optionally, the multiple sub-layer structure includes at least a first metallic sub-layer and a second metallic sub-layer laminated together. In one example, the multiple sub-layer structure includes a copper sub-layer and a titanium sub-layer laminated together.

In another aspect, the present disclosure provides a method of fabricating an array substrate. In some embodiments, the method includes forming a first bonding pad layer including a plurality of first bonding pads on a first side of a base substrate; forming a second bonding pad layer including a plurality of second bonding pads on a second side of the base substrate, wherein the second side is opposite to the first side; and forming a plurality of signal lines on a side of the second bonding pad layer away from the base substrate. Optionally, the plurality of signal lines are respectively electrically connected to the plurality of second bonding pads. Optionally, a respective one of the plurality of second bonding pads extends through the base substrate to electrically connect to a respective one of the plurality of first bonding pads. Optionally, the respective one of the plurality of first bonding pads comprises a protruding portion protruding away from the first side of the base substrate along a direction from the second side to the first side.

In some embodiments, the step of forming the first bonding pad layer includes providing a support substrate; forming a plurality of first vias in the support substrate or in a layer on the support substrate; forming a first conductive material layer at least partially filling in the plurality of first vias; and patterning the first conductive material layer to obtain the plurality of first bonding pads, thereby forming the first bonding pad layer.

In some embodiments, the step of forming the plurality of first vias includes forming a first insulating material layer on the support substrate. Optionally, the plurality of first vias are formed at least partially extending into the first insulating material layer; and the first conductive material layer is formed on a side of the first insulating material layer away from the support substrate.

In some embodiments, the step of forming the plurality of first vias includes patterning the support substrate to form the plurality of first vias. Optionally, the plurality of first vias at least partially extend into the support substrate; and the first conductive material layer is formed on the support substrate.

In some embodiments, subsequent to forming the first bonding pad layer, the method further includes forming a second insulating material layer on a side of the first bonding pad layer away from the first insulating material layer; forming a plurality of second vias extending through the second insulating material layer, thereby forming the base substrate; forming a second conductive material layer on a side of the base substrate away from the first bonding pad layer, wherein the second conductive material layer at least partially fills in the plurality of second vias; and patterning the second conductive material layer to obtain the plurality of second bonding pads, thereby forming the second bonding pad layer.

In some embodiments, subsequent to forming the plurality of first vias and prior to forming the first conductive material layer, the method further includes forming a debonding layer on the support substrate. Optionally, the first conductive material layer and the base substrate are formed on a side of the debonding layer away from the support substrate.

Optionally, the debonding layer is formed to be in direct contact with the support substrate. Optionally, the debonding layer has a first adhesive strength to the support substrate, a second adhesive strength to the base substrate, and a third adhesive strength to the first bonding pad layer, the first adhesive strength being greater than the second adhesive strength and greater than the third adhesive strength.

Optionally, subsequent to forming the plurality of first vias and prior to forming the first conductive material layer, the method further includes forming an intermediate layer on a side of the first insulating material layer away from the support substrate. Optionally, the debonding layer is formed on a side of the intermediate layer away from the first insulating material layer; and the debonding layer has a first adhesive strength to the intermediate layer, a second adhesive strength to the base substrate, and a third adhesive strength to the first bonding pad layer, the first adhesive strength being greater than the second adhesive strength and greater than the third adhesive strength.

Optionally, the plurality of first bonding pads and the debonding layer together form a substantially flat surface.

Optionally, the respective one of the plurality of first bonding pads further includes a base portion. Optionally, the base portion protrudes above an entire surface of the debonding layer, including a surface of the debonding layer in regions not covered by the plurality of first bonding pads.

Optionally, the intermediate layer is formed using an inorganic insulating material; the debonding layer is formed using an organic resin material; the first insulating material layer is formed using a flexible material; and the first bonding pad layer and the second bonding pad layer are formed using a metallic material.

In some embodiments, the method further includes separating the debonding layer from the base substrate and the first bonding pad layer, thereby removing the debonding layer and the support substrate, exposing the protruding portion of the respective one of the plurality of first bonding pads.

Figure 3A:
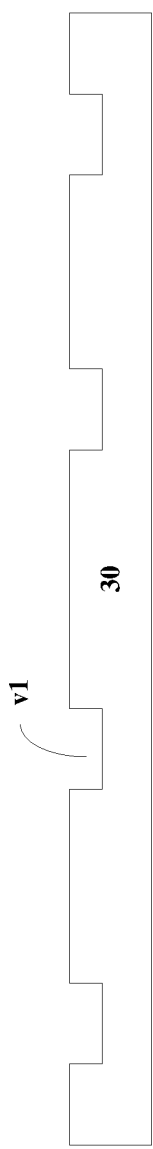
FIGS. 3A to 3F illustrate a method of fabricating an array substrate in some embodiments according to the present disclosure.

FIGS. 3A to 3F illustrate a method of fabricating an array substrate in some embodiments according to the present disclosure. Referring to FIG. 3A, a support substrate 30 is provided, and a plurality of first vias v1 is formed in the support substrate 30. Optionally, the plurality of first vias v1 are blind vias that only partially extending into the support substrate 30, as shown in FIG. 3A. In one example, prior to forming the plurality of first vias v1, in regions of support substrate 30 wherein the plurality of first vias v1 are to be formed, the material of the support substrate 30 is first modified, and then is etched using an etchant such as hydrofluoric acid solution. The etching duration can be controlled to achieve a desired depth of the plurality of first vias v1. Optionally, the plurality of first vias v1 are formed to have a depth in a range of 500 nm to 1000 nm.

Figure 3B:
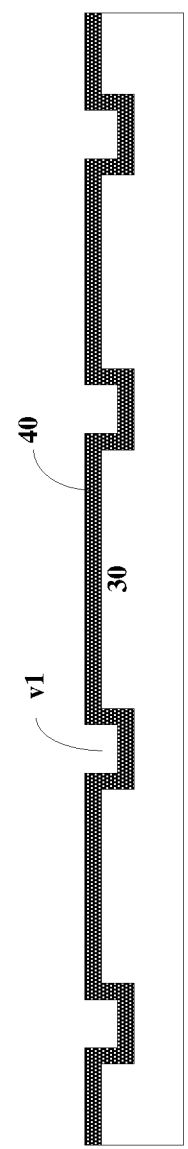

Referring to FIG. 3B, subsequent to forming the plurality of first vias v1, a debonding layer 40 is formed on the support substrate 30. The debonding layer 40 is formed to cover a surface of the support substrate 30, including the internal surfaces of the plurality of first vias. The debonding layer 40 is formed to be in direct contact with the support substrate 30. Various appropriate debonding materials and various appropriate fabricating methods may be used to make the debonding layer 40. Examples of debonding materials suitable for making the debonding layer 40 include various organic resins, particularly heat-resistant organic resins. Optionally, the debonding layer 40 is formed to have a thickness equal to or greater than 50 nm.

Figure 3C:
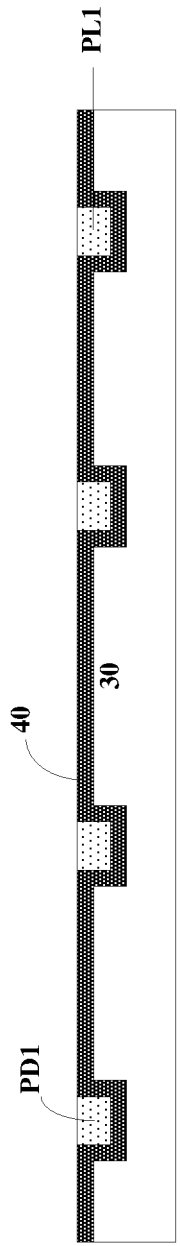

Referring to FIG. 3C, subsequent to forming the debonding layer 40, a first bonding pad layer PL1 is formed on a side of the debonding layer 40 away from the support substrate 30. The first bonding pad layer PL1 is formed to include a plurality of first bonding pads PD1 at least partially filling in the plurality of first vias. The step of forming the first bonding pad layer PL1 optionally includes forming a first conductive material layer at least partially filling in the plurality of first vias; and patterning the first conductive material layer to obtain the plurality of first bonding pads PD1, thereby forming the first bonding pad layer PL1. In one example, the first conductive material layer is formed by depositing a first conductive material by magnetron sputtering.

In some embodiments, the first bonding pad layer PL1 (and thus each of the plurality of first bonding pads PD1) is formed to have a multiple sub-layer structure. Optionally, the first bonding pad layer PL1 is formed to have two sub-layers. Optionally, the first bonding pad layer PL1 is formed to have three sub-layers. In one example, the multiple sub-layer structure includes a titanium/aluminum/titanium laminated structure, and optionally, thicknesses of each of the titanium sub-layer is 50 nm and a thickness of the aluminum sub-layer is 650 nm. In another example, the multiple sub-layer structure includes a molybdenum-containing alloy/copper/molybdenum-containing alloy laminated structure, and optionally, thicknesses of each of the molybdenum-containing alloy sub-layer is 30 nm and a thickness of the copper sub-layer is 300 nm. In another example, the multiple sub-layer structure includes a molybdenum/aluminum-neodymium alloy/molybdenum laminated structure, and optionally, thicknesses of each of the molybdenum sub-layer is 20 nm and a thickness of the aluminum-neodymium alloy sub-layer is 300 nm. Optionally, the first conductive material layer is formed to have a multiple sub-layer structure.

In another example, the step of forming first conductive material layer includes first depositing a first sub-layer (e.g., a seed sub-layer) including a first metal, followed by electroplating a second metal to form a second sub-layer on the first sub-layer. Any metal or alloy having a relatively high adhesiveness to the debonding layer 40, and having a relatively good ability to prevent diffusion of the second metal may be used as the material for making the seed sub-layer. Optionally, the seed sub-layer is formed to have a thickness in a range of 1 nm to 10 nm. Examples of appropriate metallic materials for making the seed sub-layer include titanium, tantalum, chromium, titanium-tungsten alloy, tantalum nitride, and titanium nitride. Examples of appropriate metallic materials for making the second sub-layer include copper. The second sub-layer is formed on a side of the seed sub-layer away from the debonding layer 40.

Figure 3D:
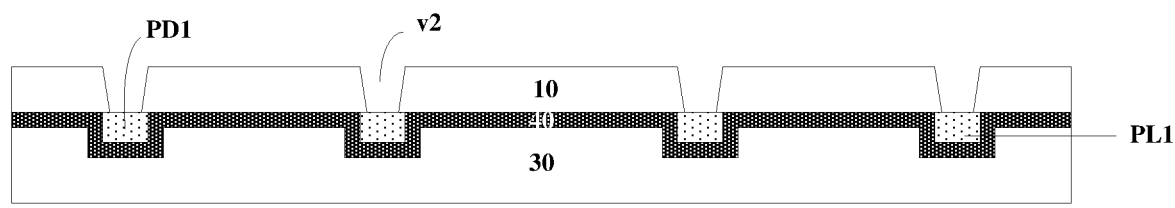

Referring to FIG. 3D, a base substrate 10 is formed on a side of the plurality of first bonding pads PD1 and the debonding layer 40 away from the support substrate 30. The base substrate 10 is formed to have a plurality of second vias v2 extending there-through. In one example, the base substrate 10 is made of polyimide. Optionally, the step of forming the base substrate 10 includes forming an insulating material layer on a side of the first bonding pad layer PL1 and the debonding layer 40 away from the support substrate 30; and forming a plurality of second vias v2 extending through the insulating material layer, thereby forming the base substrate 10.

In some embodiments, the debonding layer 40 has a first adhesive strength to the support substrate 30, a second adhesive strength to the base substrate 10, and a third adhesive strength to the first bonding pad layer PL1, the first adhesive strength being greater than the second adhesive strength and greater than the third adhesive strength.

Figure 3E:
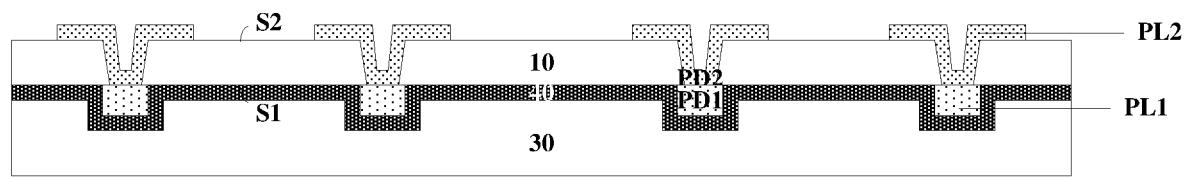

Referring to FIG. 3E, a second bonding pad layer PL2 is formed on a side of the base substrate 10 away from the support substrate 30. The second bonding pad layer PL2 is formed to include a plurality of second bonding pads PD2 on a second side S2 of the base substrate 10. A respective one of the plurality of second bonding pads PD2 extends through the base substrate 10 to electrically connect to a respective one of the plurality of first bonding pads PD1. The respective one of the plurality of first bonding pads PD1 include a protruding portion P protruding away from the first side S1 of the base substrate 10 along a direction from the second side S2 to the first side S1. The step of forming the second bonding pad layer PL2 optionally includes forming a second conductive material layer at least partially filling in the plurality of second vias; and patterning the second conductive material layer to obtain the plurality of second bonding pads PD2, thereby forming the second bonding pad layer PL2. In one example, the second conductive material layer is formed by depositing a conductive material (e.g., copper) by magnetron sputtering.

Figure 3F:
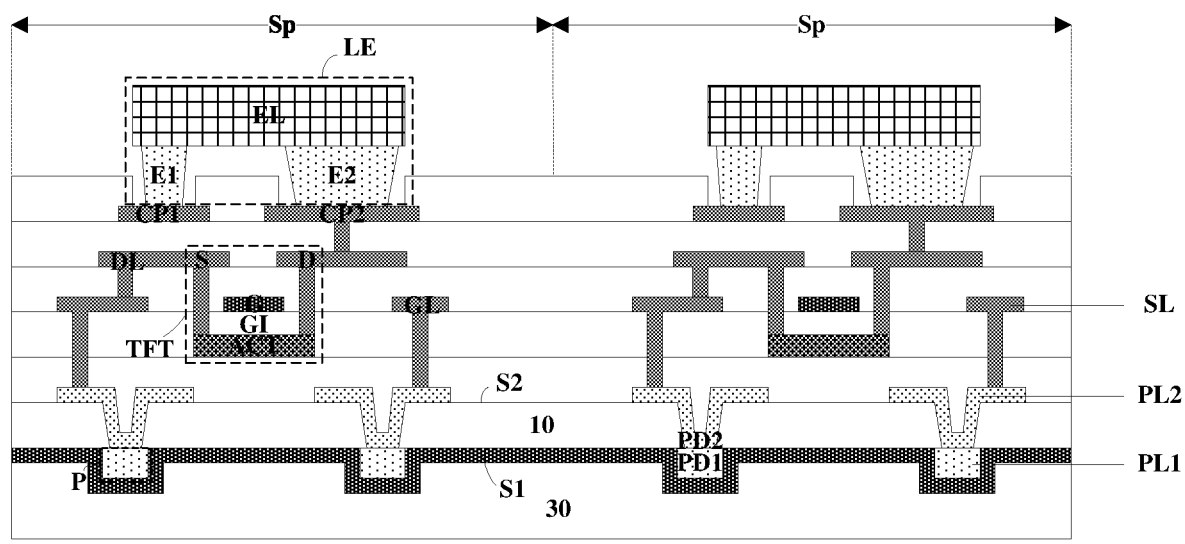

Referring to FIG. 3F, a plurality of signal lines SL and a plurality of thin film transistors TFT are subsequently formed. The plurality of signal lines SL are formed to be respectively electrically connected to the plurality of second bonding pads PD2. In one example, a plurality of micro LED are bonded onto contact pads, e.g., CP1 and CP2.

Referring to FIG. 3F and FIG. 1, the debonding layer 40 is separated from the base substrate 10 and the first bonding pad layer PL1, e.g., by laser lift-off. The debonding layer 40 and the support substrate 30 are removed, exposing the protruding portion P of the respective one of the plurality of first bonding pads PD1.

Figure 4A:
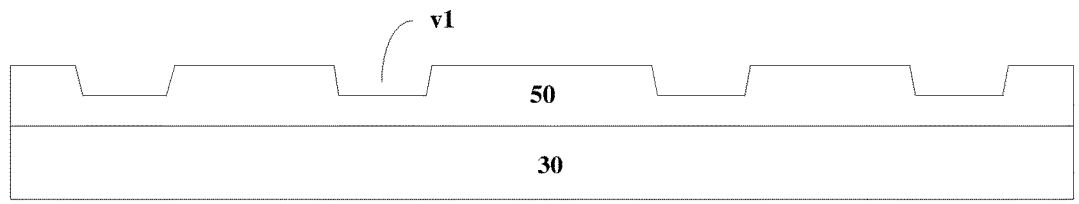
FIGS. 4A to 4G illustrate a method of fabricating an array substrate in some embodiments according to the present disclosure.

FIGS. 4A to 4G illustrate a method of fabricating an array substrate in some embodiments according to the present disclosure. Referring to FIG. 4A, a support substrate 30 is provided, and a first insulating material layer 50 is formed on the support substrate 30. The first insulating material layer 50 is formed to have a plurality of first vias v1 at least partially extending into the first insulating material layer 50. Optionally, each of the plurality of first vias v1 are formed to have a depth in a range of 800 nm to 1000 nm. Optionally, each of the plurality of first vias v1 are formed to have a width in a range of 20 μm to 70 μm. Optionally, each of the plurality of first vias v1 are formed to have a length in a range of 500 μm to 1000 μm. Optionally, the plurality of first vias v1 are blind vias that only partially extend into the first insulating material layer 50, as shown in FIG. 4A.

Figure 4B:
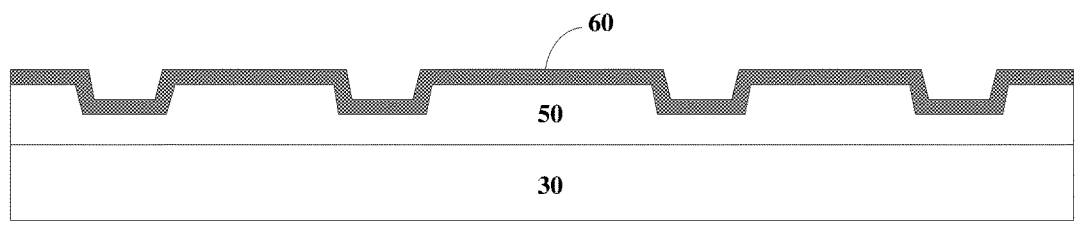

Referring to FIG. 4B, subsequent to forming the plurality of first vias, an intermediate layer 60 is formed on a side of the first insulating material layer 50 away from the support substrate 30. The intermediate layer 60 is formed to cover a surface of the first insulating material layer 50, including the internal surfaces of the plurality of first vias. The intermediate layer 60 is formed to be in direct contact with the first insulating material layer 50.

Various appropriate insulating materials and various appropriate fabricating methods may be used to make the intermediate layer 60. For example, an insulating material may be deposited on the substrate by a plasma-enhanced chemical vapor deposition (PECVD) process and patterned. Examples of inorganic insulating materials suitable for making the intermediate layer 60 include silicon oxide ($SiO_x$), silicon nitride ($SiN_y$, e.g., $Si_3N_4$), and silicon oxynitride ($SiO_xN_y$). Optionally, the intermediate layer 60 is formed to have a thickness equal to or greater than 100 nm.

Figure 4C:
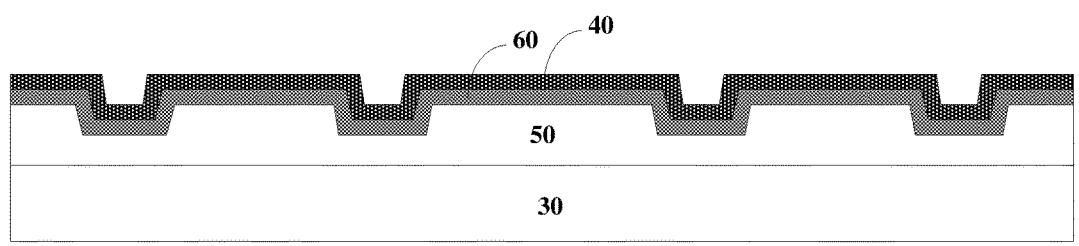

Referring to FIG. 4C, subsequent to forming the intermediate layer 60, a debonding layer 40 is formed on a side of intermediate layer 60 away from the first insulating material layer 50. Various appropriate debonding materials and various appropriate fabricating methods may be used to make the debonding layer 40. Examples of debonding materials suitable for making the debonding layer 40 include various organic resins, particularly heat-resistant organic resins. Optionally, the debonding layer 40 is formed to have a thickness equal to or greater than 50 nm.

Figure 4D:
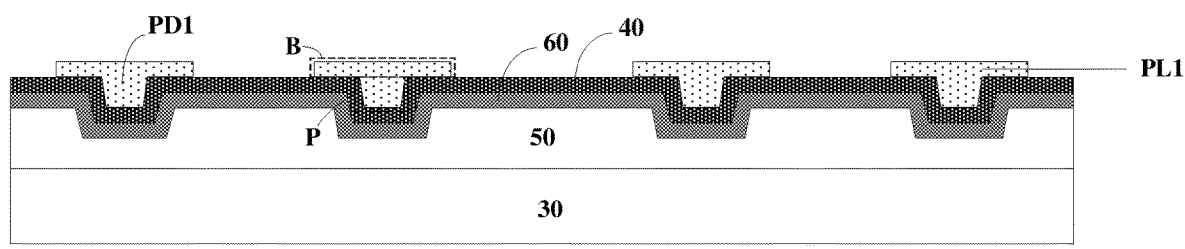

Referring to FIG. 4D, subsequent to forming the debonding layer 40, a first bonding pad layer PL1 is formed on a side of the debonding layer 40 away from the support substrate 30. The first bonding pad layer PL1 is formed to include a plurality of first bonding pads PD1 at least partially filling in the plurality of first vias. The step of forming the first bonding pad layer PL1 optionally includes forming a first conductive material layer at least partially filling in the plurality of first vias; and patterning the first conductive material layer to obtain the plurality of first bonding pads PD1, thereby forming the first bonding pad layer PL1. In one example, the first conductive material layer is formed by depositing a first conductive material by magnetron sputtering.

In some embodiments, the first bonding pad layer PL1 (and thus each of the plurality of first bonding pads PD1) is formed to have a multiple sub-layer structure. Optionally, the first bonding pad layer PL1 is formed to have two sub-layers. Optionally, the first bonding pad layer PL1 is formed to have three sub-layers. In one example, the multiple sub-layer structure includes a titanium/aluminum/titanium laminated structure, and optionally, thicknesses of each of the titanium sub-layer is 50 nm and a thickness of the aluminum sub-layer is 650 nm. In another example, the multiple sub-layer structure includes a molybdenum-containing alloy/copper/molybdenum-containing alloy laminated structure, and optionally, thicknesses of each of the molybdenum-containing alloy sub-layer is 30 nm and a thickness of the copper sub-layer is 300 nm. In another example, the multiple sub-layer structure includes a molybdenum/aluminum-neodymium alloy/molybdenum laminated structure, and optionally, thicknesses of each of the molybdenum sub-layer is 20 nm and a thickness of the aluminum-neodymium alloy sub-layer is 300 nm. Optionally, the first conductive material layer is formed to have a multiple sub-layer structure.

In another example, the step of forming the first conductive material layer includes first depositing a first sub-layer (e.g., a seed sub-layer) including a first metal, followed by electroplating a second metal to form a second sub-layer on the first sub-layer. Any metal or alloy having a relatively high adhesiveness to the debonding layer 40, and having a relatively good ability to prevent diffusion of the second metal may be used as the material for making the seed sub-layer. Optionally, the seed sub-layer is formed to have a thickness in a range of 1 nm to 10 nm. Examples of appropriate metallic materials for making the seed sub-layer include titanium, tantalum, chromium, titanium-tungsten alloy, tantalum nitride, and titanium nitride. Examples of appropriate metallic materials for making the second sub-layer include copper. The second sub-layer is formed on a side of the seed sub-layer away from the debonding layer 40.

The respective one of the plurality of first bonding pads PD1 include a protruding portion P protruding away from the first side S1 of the base substrate 10 along a direction from the second side S2 to the first side S1; and a base portion B protrudes above an entire surface of the debonding layer 40, including a surface of the debonding layer 40 in regions not covered by the plurality of first bonding pads PD1.

Figure 4E:
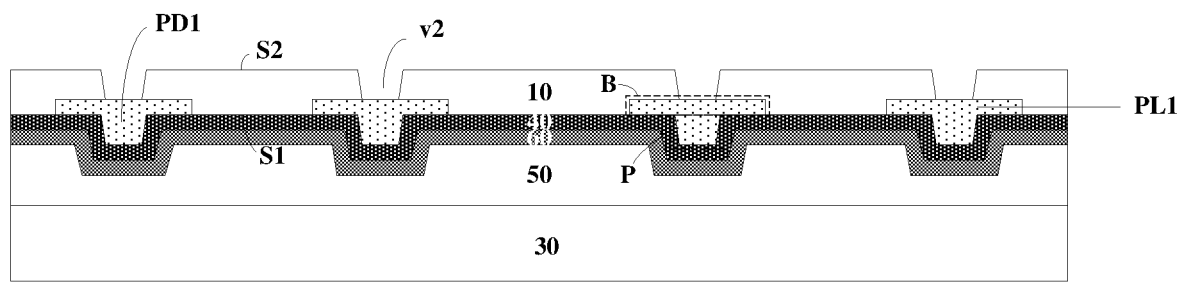

Referring to FIG. 4E, a base substrate 10 is formed on a side of the plurality of first bonding pads PD1 and the debonding layer 40 away from the support substrate 30. The base substrate 10 is formed to have a plurality of second vias v2 extending there-through. In one example, the base substrate 10 is made of polyimide. Optionally, the step of forming the base substrate 10 includes forming an insulating material layer on a side of the first bonding pad layer PL1 and the debonding layer 40 away from the support substrate 30; and forming a plurality of second vias v2 extending through the insulating material layer, thereby forming the base substrate 10. Optionally, the base substrate is formed to have a thickness around 5 μm.

In some embodiments, the debonding layer 40 has a first adhesive strength to the intermediate layer 60, a second adhesive strength to the base substrate 10, and a third adhesive strength to the first bonding pad layer PL1, the first adhesive strength being greater than the second adhesive strength and greater than the third adhesive strength.

Figure 4F:
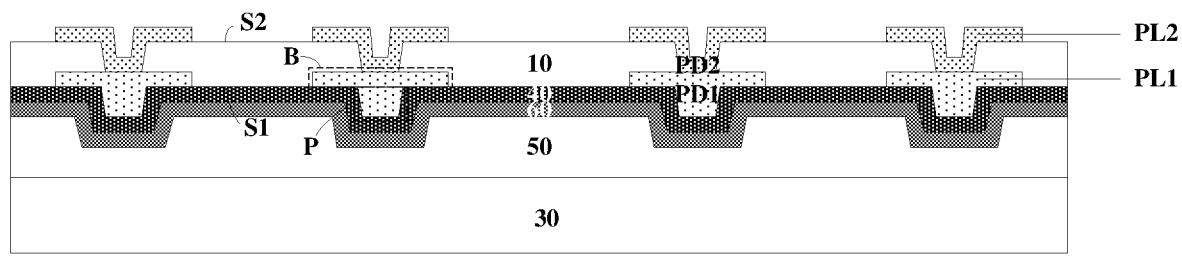

Referring to FIG. 4F, a second bonding pad layer PL2 is formed on a side of the base substrate 10 away from the support substrate 30. The second bonding pad layer PL2 is formed to include a plurality of second bonding pads PD2 on a second side S2 of the base substrate 10. A respective one of the plurality of second bonding pads PD2 extends through the base substrate 10 to electrically connect to a respective one of the plurality of first bonding pads PD1. The step of forming the second bonding pad layer PL2 optionally includes forming a second conductive material layer at least partially filling in the plurality of second vias; and patterning the second conductive material layer to obtain the plurality of second bonding pads PD2, thereby forming the second bonding pad layer PL2. In one example, the second conductive material layer is formed by depositing a conductive material (e.g., copper) by magnetron sputtering.

Figure 4G:
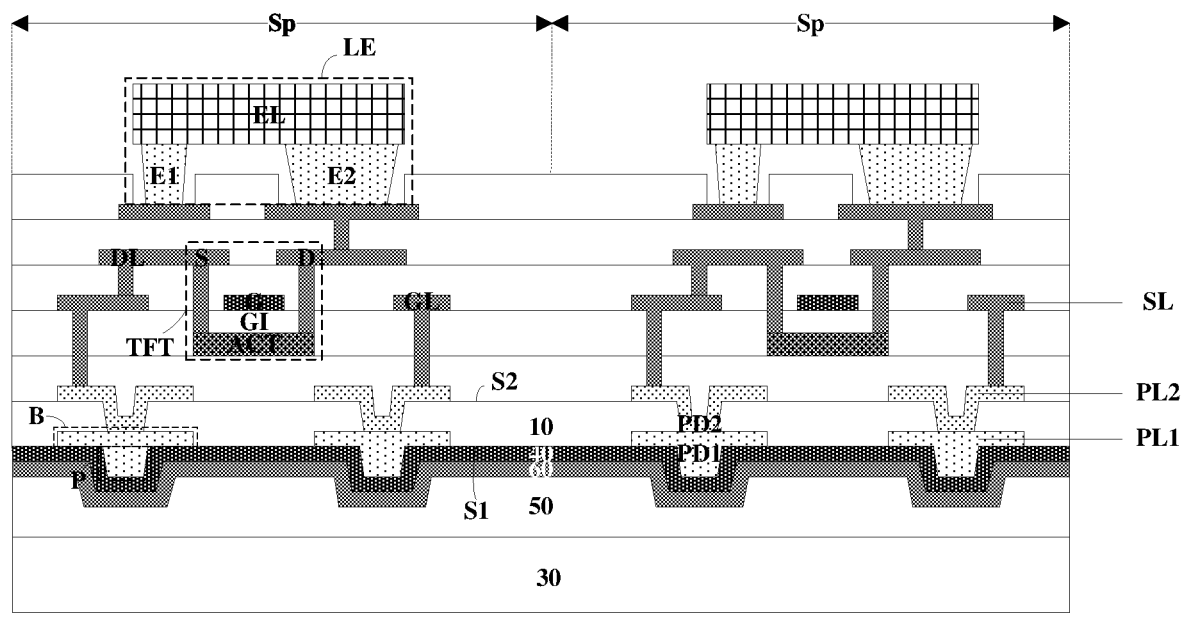

Referring to FIG. 4G, a plurality of signal lines SL and a plurality of thin film transistors TFT are subsequently formed. The plurality of signal lines SL are formed to be respectively electrically connected to the plurality of second bonding pads PD2. In one example, a plurality of micro LED are bonded onto contact pads, e.g., CP1 and CP2.

Referring to FIG. 4G and FIG. 2, the debonding layer 40 is separated from the base substrate 10 and the first bonding pad layer PL1, e.g., by laser lift-off. The debonding layer 40, the intermediate layer 60, the first insulating material layer 50, and the support substrate 30 are removed, exposing the protruding portion P of the respective one of the plurality of first bonding pads PD1.

Figure 5:
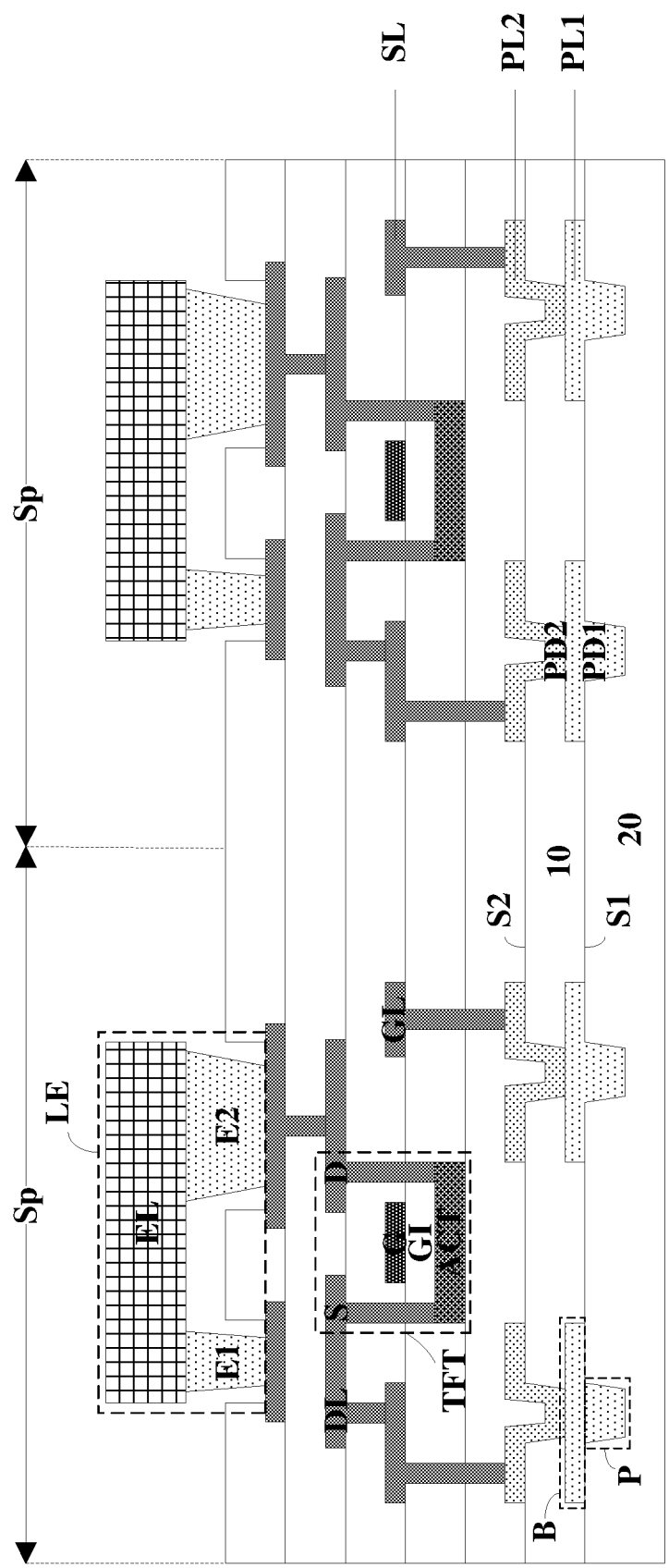
FIG. 5 is a cross-sectional view of a display apparatus in some embodiments according to the present disclosure.

In another aspect, the present disclosure provides a display apparatus including an array substrate described herein or fabricated by a method described herein. FIG. 5 is a cross-sectional view of a display apparatus in some embodiments according to the present disclosure. Referring to FIG. 5, the display apparatus further includes one or more integrated driving circuits 20 connected to the array substrate. In one example, the one or more integrated driving circuits 20 are attached to the first side S1 of the base substrate 10. The plurality of signal lines SL are respectively connected to the one or more integrated driving circuits 20 through the plurality of first bonding pads PD1 and the plurality of second bonding pads PD2. Various appropriate driving circuits may be attached to the first side S1 of the base substrate 10 and bond to the plurality of signal lines SL. Examples of driving circuits include a gate driving circuit for providing gate scanning signals to the plurality of gate lines GL, a data driving circuit for providing data signals to the plurality of data lines DL, a touch control driving circuit for providing touch scanning signals to the plurality of touch control signal lines. These driving circuits may be integrated circuits. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a base substrate;
   a first bonding pad layer comprising a plurality of first bonding pads on a first side of the base substrate;
   a second bonding pad layer comprising a plurality of second bonding pads on a second side of the base substrate, wherein the second side is opposite to the first side; and
   a plurality of signal lines on a side of the second bonding pad layer away from the base substrate;
   wherein the plurality of signal lines are respectively electrically connected to the plurality of second bonding pads;
   a respective one of the plurality of second bonding pads extends through the base substrate to electrically connect to a respective one of the plurality of first bonding pads; and
   the respective one of the plurality of first bonding pads comprises a protruding portion protruding away from the first side of the base substrate along a direction from the second side to the first side.

2. The array substrate of claim 1, wherein an orthographic projection of the respective one of the plurality of second bonding pads on the base substrate at least partially overlaps with an orthographic projection of the respective one of the plurality of first bonding pads on the base substrate.

3. The array substrate of claim 1, wherein the respective one of the plurality of first bonding pads further comprises a base portion recessing into the first side of the base substrate along a direction from the first side to the second side; and
   the respective one of the plurality of second bonding pads is electrically connected to the protruding portion of the respective one of the plurality of first bonding pads through the base portion of the respective one of the plurality of first bonding pads.

4. The array substrate of claim 3, wherein an orthographic projection of the base portion on the base substrate covers an orthographic projection of the protruding portion on the base substrate.

5. The array substrate of claim 1, wherein the protruding portion has a thickness relative to the first side of the base substrate along the direction from the second side to the first side greater than 500 nm.

6. The array substrate of claim 1, wherein the plurality of signal lines comprise a plurality of gate lines and a plurality of data lines;
the plurality of first bonding pads comprise a plurality of first gate line bonding pads and a plurality of first data line bonding pads;
the plurality of second bonding pads comprise a plurality of second gate line bonding pads and a plurality of second data line bonding pads;
the plurality of first gate line bonding pads are respectively electrically connected to the plurality of gate lines respectively through the plurality of second gate line bonding pads; and
the plurality of first data line bonding pads are respectively electrically connected to the plurality of data lines respectively through the plurality of second data line bonding pads.

7. The array substrate of claim 1, wherein the first bonding pad layer has a multiple sub-layer structure.

8. A display apparatus, comprising the array substrate of claim 1, and one or more integrated driving circuits connected to the array substrate;
wherein the one or more integrated driving circuits are attached to the first side of the base substrate.

9. A method of fabricating an array substrate, comprising:
forming a first bonding pad layer comprising a plurality of first bonding pads on a first side of a base substrate;
forming a second bonding pad layer comprising a plurality of second bonding pads on a second side of the base substrate, wherein the second side is opposite to the first side; and
forming a plurality of signal lines on a side of the second bonding pad layer away from the base substrate;
wherein the plurality of signal lines are respectively electrically connected to the plurality of second bonding pads;
a respective one of the plurality of second bonding pads extends through the base substrate to electrically connect to a respective one of the plurality of first bonding pads; and
the respective one of the plurality of first bonding pads comprises a protruding portion protruding away from the first side of the base substrate along a direction from the second side to the first side.

10. The method of claim 9, wherein forming the first bonding pad layer comprises:
providing a support substrate;
forming a plurality of first vias in the support substrate or in a layer on the support substrate;
forming a first conductive material layer at least partially filling in the plurality of first vias; and
patterning the first conductive material layer to obtain the plurality of first bonding pads, thereby forming the first bonding pad layer.

11. The method of claim 10, wherein forming the plurality of first vias comprises:
forming a first insulating material layer on the support substrate;
wherein the plurality of first vias are formed at least partially extending into the first insulating material layer; and
the first conductive material layer is formed on a side of the first insulating material layer away from the support substrate.

12. The method of claim 10, wherein forming the plurality of first vias comprises:
patterning the support substrate to form the plurality of first vias;
wherein the plurality of first vias at least partially extend into the support substrate; and
the first conductive material layer is formed on the support substrate.

13. The method of claim 11, subsequent to forming the first bonding pad layer, further comprising:
forming a second insulating material layer on a side of the first bonding pad layer away from the first insulating material layer;
forming a plurality of second vias extending through the second insulating material layer, thereby forming the base substrate;
forming a second conductive material layer on a side of the base substrate away from the first bonding pad layer, wherein the second conductive material layer at least partially fills in the plurality of second vias; and
patterning the second conductive material layer to obtain the plurality of second bonding pads, thereby forming the second bonding pad layer.

14. The method of claim 13, subsequent to forming the plurality of first vias and prior to forming the first conductive material layer, further comprising forming a debonding layer on the support substrate;
wherein the first conductive material layer and the base substrate are formed on a side of the debonding layer away from the support substrate.

15. The method of claim 14, wherein the debonding layer is formed to be in direct contact with the support substrate; and
the debonding layer has a first adhesive strength to the support substrate, a second adhesive strength to the base substrate, and a third adhesive strength to the first bonding pad layer, the first adhesive strength being greater than the second adhesive strength and greater than the third adhesive strength.

16. The method of claim 14, subsequent to forming the plurality of first vias and prior to forming the first conductive material layer, further comprising:
forming an intermediate layer on a side of the first insulating material layer away from the support substrate;
wherein the debonding layer is formed on a side of the intermediate layer away from the first insulating material layer; and
the debonding layer has a first adhesive strength to the intermediate layer, a second adhesive strength to the base substrate, and a third adhesive strength to the first bonding pad layer, the first adhesive strength being greater than the second adhesive strength and greater than the third adhesive strength.

17. The method of claim 14, wherein the plurality of first bonding pads and the debonding layer together form a substantially flat surface.

18. The method of claim 14, wherein the respective one of the plurality of first bonding pads further comprises a base portion; and
the base portion protrudes above an entire surface of the debonding layer.

19. The method of claim 16, wherein the intermediate layer is formed using an inorganic insulating material;

the debonding layer is formed using an organic resin material;

the first insulating material layer is formed using a flexible material; and the first bonding pad layer and the second bonding pad layer are formed using a metallic material.

20. The method of claim 14, further comprising:

separating the debonding layer from the base substrate and the first bonding pad layer, thereby removing the debonding layer and the support substrate, exposing the protruding portion of the respective one of the plurality of first bonding pads.

* * * * *